United States Patent
Kam et al.

(10) Patent No.: US 9,806,276 B2
(45) Date of Patent: Oct. 31, 2017

(54) ORGANIC LIGHT EMITTING DISPLAY APPARATUS

(71) Applicant: LG DISPLAY CO., LTD., Seoul (KR)

(72) Inventors: Younseok Kam, Seoul (KR); Chang Wook Han, Seoul (KR); Hongseok Choi, Seoul (KR); SoYeon Ahn, Seoul (KR); Taeshick Kim, Yongin-si (KR); Mingyu Lee, Daegu (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 15/189,739

(22) Filed: Jun. 22, 2016

(65) Prior Publication Data

US 2017/0084855 A1  Mar. 23, 2017

(30) Foreign Application Priority Data

Sep. 18, 2015 (KR) ........................ 10-2015-0132270

(51) Int. Cl.
| | | |
|---|---|---|
| *H01L 51/50* | (2006.01) | |
| *H01L 51/52* | (2006.01) | |
| *H01L 27/32* | (2006.01) | |

(52) U.S. Cl.
CPC ........ *H01L 51/504* (2013.01); *H01L 27/3209* (2013.01); *H01L 51/5004* (2013.01); *H01L 51/5056* (2013.01); *H01L 51/5064* (2013.01); *H01L 51/5265* (2013.01); *H01L 51/5278* (2013.01); *H01L 27/3244* (2013.01); *H01L 2251/552* (2013.01); *H01L 2251/558* (2013.01)

(58) Field of Classification Search
CPC ............... H01L 51/504; H01L 51/5004; H01L 51/5056; H01L 51/5064; H01L 51/5265; H01L 51/5278; H01L 27/3209
See application file for complete search history.

(56) References Cited

U.S. PATENT DOCUMENTS

| | | | | |
|---|---|---|---|---|
| 8,404,363 | B2* | 3/2013 | Okinaka | H01L 51/5012 313/504 |
| 9,543,538 | B2* | 1/2017 | Kim | H01L 51/5096 |
| 9,548,459 | B2* | 1/2017 | Kwong | C07D 409/14 |
| 2004/0209116 | A1* | 10/2004 | Ren | C09K 11/06 428/690 |
| 2006/0232194 | A1* | 10/2006 | Tung | C09K 11/06 313/504 |
| 2012/0235131 | A1* | 9/2012 | Okamoto | H01L 51/5004 257/40 |

(Continued)

FOREIGN PATENT DOCUMENTS

WO 2013/118812 A1 8/2013

*Primary Examiner* — Ida M Soward
(74) *Attorney, Agent, or Firm* — Dentons US LLP

(57) ABSTRACT

Disclosed is an organic light emitting display (OLED) apparatus with improved efficiency and lifespan, wherein the OLED apparatus includes an anode, a cathode, and a light-emitting unit disposed in-between, wherein the light-emitting unit includes a first emission layer, and a first hole transporting layer having first and second materials, wherein the first material has a higher hole mobility than that of the second material so as to improve a transfer of holes from the first hole transporting layer to the first emission layer, and the second material has a higher triplet energy level than that of the first material so as to reduce a transfer of electrons from the first emission layer to the first hole transporting layer.

19 Claims, 8 Drawing Sheets

(56) References Cited

U.S. PATENT DOCUMENTS

| | | | |
|---|---|---|---|
| 2013/0313535 A1 | 11/2013 | Heo et al. | |
| 2014/0183496 A1* | 7/2014 | Heo | H01L 27/3209 257/40 |
| 2014/0339529 A1 | 11/2014 | Tani et al. | |
| 2014/0353624 A1 | 12/2014 | Kim et al. | |
| 2015/0108456 A1 | 4/2015 | Shin et al. | |
| 2016/0254475 A1* | 9/2016 | Tsukamoto | H01L 51/5012 257/40 |
| 2016/0260920 A1* | 9/2016 | Rausch | H01L 51/0078 |
| 2016/0293896 A1* | 10/2016 | Rausch | H01L 51/5036 |
| 2016/0351823 A1* | 12/2016 | Nagaoka | C07D 491/048 |
| 2017/0062731 A1* | 3/2017 | Ogiwara | C07D 405/14 |
| 2017/0110667 A1* | 4/2017 | Nishimura | H01L 51/0058 |

* cited by examiner

|  | Volt (V) | lm/W |
|---|---|---|
| Comparative example | 11.5 | 23.4 |
| Embodiment | 11.6 | 23.2 |

ORGANIC LIGHT EMITTING DISPLAY APPARATUS

CROSS REFERENCE TO RELATED APPLICATIONS

This application claims the benefit of the Korean Patent Application No. 10-2015-0132270 filed on Sep. 18, 2015, which is hereby incorporated by reference as if fully set forth herein.

BACKGROUND

Field of the Disclosure

The present disclosure relates to an organic light emitting display apparatus (OLED apparatus). More particularly, the present disclosure relates to an OLED apparatus with improved efficiency and long lifespan.

Discussion of the Related Art

An organic light emitting display (OLED) apparatus is a next generation display apparatus having self-luminance properties. In more detail, an OLED apparatus displays images by producing excitons through a recombination of holes and electrons, which are respectively injected from the anode and cathode, in a light emitting layer, and generating light with a specific wavelength by an energy emission of the produced excitons.

Unlike a liquid crystal display (LCD) apparatus, an OLED apparatus typically does not require an additional light source. Thus, an OLED apparatus is light weight and has a thin profile. In comparison to an LCD apparatus, an OLED apparatus has various advantages such as wide viewing angle, good contrast ratio, rapid response speed and low power consumption, whereby an OLED apparatus has attracted great attentions as a next generation display apparatus.

SUMMARY

An OLED apparatus having self-luminance properties may include an anode, a cathode, and an emission layer between the anode and the cathode, and may further include organic layers such as an injecting layer and a transporting layer between the anode and the cathode. The properties of the OLED apparatus, for example, driving voltage, light-emission efficiency, and lifespan of the OLED apparatus may be directly influenced by the organic layers of the emission layer, the injecting layer, and/or the transporting layer. That is, the properties of the OLED apparatus may be determined based on the structure and/or material properties of the organic layers disposed between the anode and the cathode.

The present inventors propose a new OLED apparatus that is directed to realizing a low driving voltage, improved light-emission efficiency, and increased lifespan by a hole transporting layer of a mixed structure including two materials having different properties.

To achieve these and other advantages and in accordance with the purpose of embodiments of the disclosure, as embodied and broadly described herein, there is provided an OLED apparatus having a hole transporting layer of a mixed structure which is capable of realizing low driving voltage, improved light-emission efficiency, and increased lifespan by improving a transfer of holes from the hole transporting layer to an emission layer, and reducing a transfer of electrons from the emission layer to the hole transporting layer.

According to one embodiment of the present disclosure, there is provided an organic light emitting display (OLED) apparatus that may include an anode, a cathode, and a light-emitting unit between the anode and the cathode, wherein the light-emitting unit includes a first emission layer, and a first hole transporting layer having first and second materials. The first material may have a larger hole mobility than that of the second material so as to improve a transfer of holes from the first hole transporting layer to the first emission layer, and the second material may have a higher triplet energy level than that of the first material so as to reduce a transfer of electrons from the first emission layer to the first hole transporting layer. Accordingly, it is possible to it is possible to realize the low driving voltage, improved light-emission efficiency and increased lifespan in the OLED apparatus.

According to another aspect of the embodiment of the present disclosure, there is provided an OLED apparatus that may include an anode, a cathode, and at least one emission layer and at least one hole transporting layer between the anode and the cathode, wherein the at least one hole transporting layer has a mixed structure including two materials with different properties.

It is to be understood that both the foregoing general description and the following detailed description of embodiments of the present disclosure are exemplary and explanatory and are intended to provide further explanation of the disclosure as claimed.

BRIEF DESCRIPTION OF THE DRAWINGS

The accompanying drawings, which are included to provide a further understanding of embodiments of the disclosure and are incorporated in and constitute a part of this application, illustrate embodiment(s) of the disclosure and together with the description serve to explain the principle of embodiments of the disclosure. In the drawings.

DETAILED DESCRIPTION OF THE ILLUSTRATED EMBODIMENTS

Figure 1:
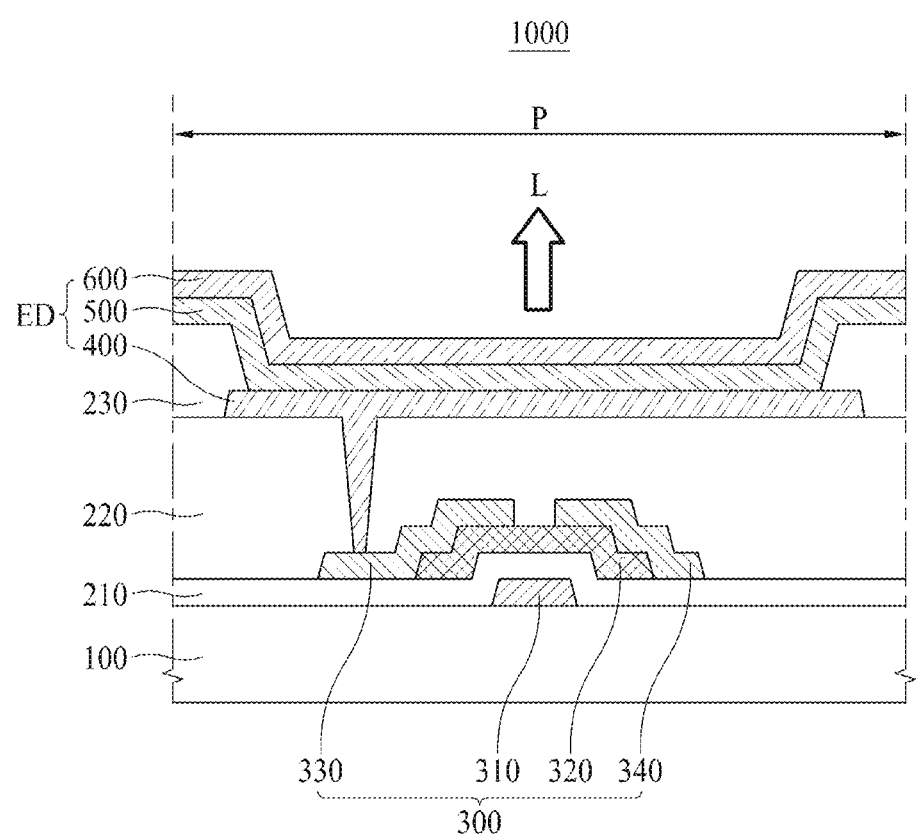
FIG. 1 is a cross sectional view illustrating an OLED apparatus according to one embodiment of the present disclosure.

Reference will now be made in detail to exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In description of embodiments of the present disclosure, when a structure (for example, an electrode, a line, a wiring, a layer, or a contact) is described as being formed at an upper portion/lower portion of another structure or on/under the other structure, this description should be construed as including a case where the structures contact each other and moreover, a case where a third structure is disposed therebetween.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

For convenience of explanation, a size and a thickness of each element are shown as exemplary in the drawings, but not limited to the shown size and thickness.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an organic light emitting display apparatus (OLED apparatus) according to embodiments of the present disclosure will be described in detail with reference to the accompanying drawings.

FIG. 1 is a cross sectional view illustrating an OLED apparatus 1000 according to one embodiment of the present disclosure.

Referring to FIG. 1, the OLED apparatus 1000 may include a substrate 100, a thin film transistor 300, and a light-emitting device (ED). The OLED apparatus 1000 may include a plurality of pixels (P). The pixel (P) indicates a minimum unit for emitting light, which may also be referred to as a sub-pixel or a pixel region. Also, the plurality of pixels may constitute one group for expressing white light. For example, a red pixel, a green pixel, and a blue pixel may constitute one group, or a red pixel, a green pixel, a blue pixel, and a white pixel may constitute one group. However, it is not limited to this structure, that is, various pixel designs are possible. For convenience of explanation, FIG. 1 shows only one pixel (P).

The thin film transistor 300 is disposed on the substrate 100, and supplies various signals to the light-emitting device (ED). The thin film transistor 300 shown in FIG. 1 may be a driving thin film transistor connected with an anode 400 of the light-emitting device (ED). Additionally, a switching thin film transistor or a capacitor for driving the light-emitting device (ED) may be disposed on the substrate 100.

The substrate 100 is formed of an insulating material. For example, the substrate 100 may be formed of a flexible film of glass or a polyimide-based material.

The thin film transistor 300 may include a gate electrode 310, an active layer 320, a source electrode 330, and a drain electrode 340. Referring to FIG. 1, the gate electrode 310 is disposed on the substrate 100, and a gate insulating layer 210 covers the gate electrode 310. Also, the active layer 320 is disposed on the gate insulating layer 210, and is overlapped with the gate electrode 310. The source electrode 330 and the drain electrode 340 are disposed on the active layer 320, and the source electrode 330 and the drain electrode 340 are spaced apart from each other.

In the description of embodiments of the present disclosure, if two elements are overlapped with each other, the two elements may be at least partially overlapped with each other regardless of another element interposed in-between, and they may be referred to as various names.

The gate electrode 310, the source electrode 330, and the drain electrode 340 are formed of a conductive material, for example, a singular-layered structure or multi-layered structure of molybdenum (Mo), aluminum (Al), chrome (Cr), gold (Au), titanium (Ti), nickel (Ni), neodymium (Nd), copper (Cu), and their alloys, but not limited to these materials.

The active layer 320 may be formed of any one of amorphous silicon (a-Si), polycrystalline silicon (poly-Si), oxide, and organic materials, but not limited to these materials.

The gate insulating layer 210 may be formed in a singular-layered structure or multi-layered structure of inorganic material, for example, silicon oxide (SiOx), silicon nitride (SiNx), and etc.

FIG. 1 shows the thin film transistor 300 having a staggered structure, but not limited to this structure. The thin film transistor 300 may have a coplanar structure.

A planarization layer 220 is disposed on the thin film transistor 300. The planarization layer 220 is configured to expose a predetermined portion of the source electrode 330. The planarization layer 220 may have a singular-layered structure or multi-layered structure, and the planarization layer 200 may be formed of an organic material. For example, the planarization layer 220 may be formed of polyimide, acryl, and etc.

A passivation layer may be additionally provided between the planarization layer 220 and the thin film transistor 300. The passivation layer is formed of an inorganic material. The passivation layer protects the thin film transistor 300. Like the planarization layer 220, the passivation layer may expose a predetermined portion of the source electrode 330.

The light-emitting device (ED) is disposed on the planarization layer 220, wherein the light-emitting device (ED) includes an anode 400, a light-emitting unit 500, and a cathode 600. The anode 400 of the light-emitting device (ED) is connected with the source electrode 330 of the thin film transistor 300, and various signals are supplied to the anode 400 of the light-emitting device (ED) through the thin film transistor 300. According to the kind of the thin film transistor 300, the anode 400 may be connected with the drain electrode 340 of the thin film transistor 300.

The OLED apparatus 1000 of FIG. 1 is a top emission type, wherein light (L) emitted from the light-emitting unit 500 may advance to an upper direction through the cathode 600. If the OLED apparatus 1000 is a bottom emission type, light (L) emitted from the light-emitting unit 500 may advance to a lower direction through the anode 400. In this case, in order to avoid obstructing a path of the light emitted from the light-emitting unit 500, the thin film transistor 300 may be disposed in an area which is not overlapped with the anode 400 or an area which is overlapped with a bank 230.

The bank 230 is provided to divide the pixel (P), and the bank 230 covers an end of the anode 400. Referring to FIG. 1, the bank 230 exposes a predetermined portion of an upper surface of the anode 400. The bank 230 may be formed of an organic material, for example, any one of polyimide and photoacryl, but not limited to these materials.

Figure 2:
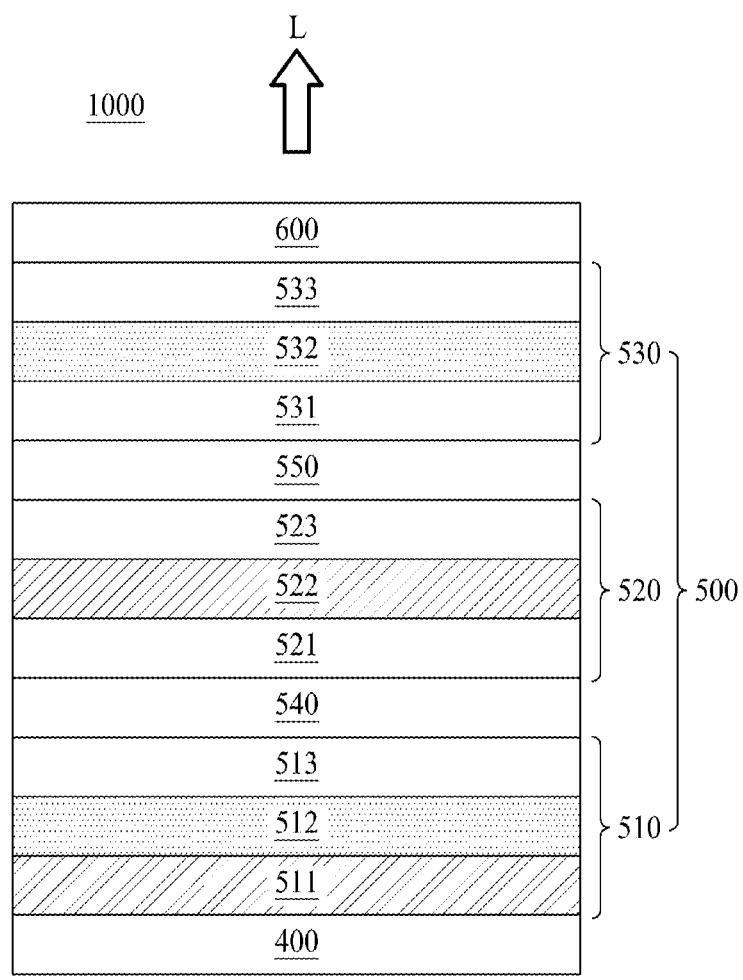
FIG. 2 is a cross sectional view illustrating the components of the OLED apparatus according to one embodiment of the present disclosure.

FIG. 2 is a cross sectional view illustrating the components of the OLED apparatus 1000 according to one embodiment of the present disclosure, which is a cross sectional view for explaining a stack structure of the light-emitting device (ED) of the OLED apparatus 1000.

Referring to FIG. 2, the light-emitting device (ED) of the OLED apparatus 1000 includes the anode 400 and cathode 600 confronting each other, and the light-emitting unit 500 disposed between the anode 400 and the cathode 600. The light-emitting unit 500 can refer to all organic layers disposed between the anode 400 and the cathode 600, or a stack structure of all organic layers disposed between the anode 400 and the cathode 600. For example, as shown in FIG. 2, the light-emitting unit 500 may be formed in a sequential stack structure of a first stack 510 including a first hole transporting layer 511, a first emission layer 512 and a first electron transporting layer 513, a second stack 520 including a second hole transporting layer 521, a second emission layer 522 and a second electron transporting layer 523, and a third stack 530 including a third hole transporting layer 531, a third emission layer 532 and a third electron transporting layer 533.

The light-emitting unit 500 of the OLED apparatus 1000 according to one embodiment of the present disclosure shown in FIG. 2 has a common emission layer structure, and emits the white light (L). The light-emitting unit 500 with the common emission layer structure may be formed by the use of a common mask with open areas corresponding to all pixels (P). The light-emitting unit 500 may be deposited in the same structure for all pixels (P) without an individual pattern for each pixel (P). The light-emitting unit 500 of the common emission layer structure may be connected or disposed without disconnection from one pixel (P) to the neighboring pixel (P) so that the light-emitting unit 500 is shared by the plurality of pixels (P). Also, the light emitted from the plurality of emission layers 512, 522 and 532 included in the light-emitting unit 500 may be mixed together, whereby the white light (L) may be emitted through the anode 400 or cathode 600 from the light-emitting unit 500.

The anode 400 is separately disposed for each pixel (P). The anode 400 is an electrode for supplying or transmitting a hole to the light-emitting unit 500, and the anode 400 is connected with the source or drain electrode of the thin film transistor. The anode 400 may be formed of a transparent layer of TCO (transparent conductive oxide) material such as ITO (indium tin oxide) or IZO (indium zinc oxide).

If the OLED apparatus 1000 according to one embodiment of the present disclosure is the top emission type, the anode 400 may further include a reflection layer for smoothly reflecting the light emitted from the light-emitting unit 500 to an upper direction. For example, the anode 400 may be formed in a dual-layered structure including a transparent layer and a reflection layer deposited in sequence, or a three-layered structure including a transparent layer, a reflection layer and another transparent layer deposited in sequence. Herein, the reflection layer may be formed of a metal material such as copper (Cu), silver (Ag), palladium (Pd), and etc.

The cathode 600 is disposed on the light-emitting unit 500, wherein the cathode 600 is an electrode for supplying or transmitting an electron to the light-emitting unit 500. The cathode 600 may be formed of a metal material such as silver (Ag), magnesium (Mg), silver-magnesium (Ag—Mg), and etc., or TCO (transparent conductive oxide) material such as ITO (indium tin oxide) or IZO (indium zinc oxide).

The light-emitting unit 500 disposed between the anode 400 and the cathode 600 includes the plurality of stacks 510, 520 and 530, and the first and second charge generation layers 540 and 550 disposed in-between the stacks 510, 520 and 530. In the embodiment of the present disclosure, the three stacks 510, 520 and 530 are disposed between the anode 400 and the cathode 600, but not limited to this structure. According to a design, the two stacks, four stacks or stacks more than four stacks may be provided.

Among the plurality of stacks 510, 520 and 530, the first stack 510 is disposed closest to the anode 400. The first stack 510 includes the first hole transporting layer 511, the first emission layer 512, and the first electron transporting layer 513.

The first hole transporting layer 511 is provided to smoothly transmit the holes, which are supplied or transmitted from the anode 400, to the light-emitting unit 500. As described above, the properties of the OLED apparatus 1000 may be determined based on the structure of organic layers included in the light-emitting unit 500 or the properties of the organic layers included in the light-emitting unit 500. Similarly, the properties of the OLED apparatus 1000, for example, driving voltage, light-emission efficiency, and lifespan may be influenced by the first hole transporting layer 511. Through various experiments, the present inventors propose a novel first hole transporting layer 511 having a mixed structure so that it is possible to lower the driving voltage and to improve the light-emission efficiency and the lifespan of the OLED apparatus 1000. This will be described in detail with reference to FIG. 3.

Figure 3:
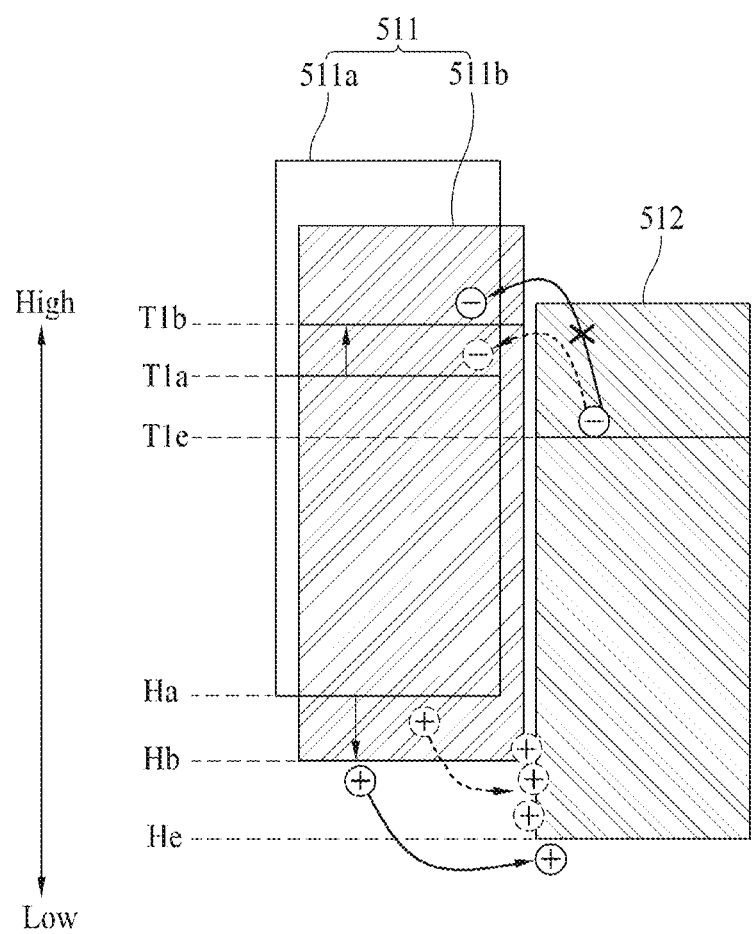
FIG. 3 illustrates an energy band diagram in the components of the OLED apparatus according to one embodiment of the present disclosure.

FIG. 3 illustrates an energy band diagram of the components included in the OLED apparatus according to one embodiment of the present disclosure. In detail, FIG. 3 illustrates the energy band diagram of the first hole transporting layer 511 and the first emission layer 512 included in the first stack 510 of the OLED apparatus of FIG. 2.

Referring to FIG. 3, the first hole transporting layer 511 of the OLED apparatus 1000 according to one embodiment of the present disclosure has the mixed structure which enables to improve the transfer of holes from the first hole transporting layer 511 to the first emission layer 512, and also to minimize the transfer of electrons from the first emission layer 512 to the first hole transporting layer 511.

In more detail, the first hole transporting layer 511 is a single layer of the mixed structure including a first material 511a and a second material 511b. In order to improve the transfer of holes from the first hole transporting layer 511 to the first emission layer 512, a hole mobility in the first material 511a of the first hole transporting layer 511 is larger than a hole mobility in the second material 511b of the first hole transporting layer 511. Also, in order to minimize the transfer of electrons from the first emission layer 512 to the first hole transporting layer 511, a triplet energy level (T1) in the second material 511b of the first hole transporting layer 511 is higher than a triplet energy level in the first material 511a of the first hole transporting layer 511.

The first material 511a included in the first hole transporting layer 511 of the mixed structure is a material whose hole mobility is larger than that of the second material 511b. The first material 511a enables to smoothly transfer the hole, which is transmitted or supplied from the anode 400, to the light-emitting unit 500. For example, the first material 511a has the hole mobility of about $1\times10^{-4}$ $cm^2$/Vs or more than $1\times10^{-4}$ $cm^2$/Vs, to thereby improve a hole transfer capacity to the light-emitting unit 500. Accordingly, the driving voltage of the OLED apparatus 1000 is lowered, and the light-emission efficiency of the OLED apparatus 1000 is improved. That is, the first hole transporting layer 511 includes the first material 511a whose hole mobility is relatively larger than that of the second material 511b, whereby it facilitates the transfer of holes. In comparison to a single structure of the first hole transporting layer 511 having only the second material 511b, the mixed structure of the OLED apparatus according to one embodiment of the present disclosure enables to lower the driving voltage of the OLED apparatus 1000, and to improve the light-emission efficiency of the OLED apparatus 1000.

If the first hole transporting layer 511 is formed only by the material having the excessively-large hole mobility in order to improve the hole transfer capacity of the OLED apparatus 1000, a balance of electrons and holes injected into the light-emitting unit 500 is not maintained so that the lifespan of the OLED apparatus 1000 is shortened. That is, if the excessively-large amount of holes is injected into the light-emitting unit 500 in comparison to the amount of electrons, it inevitably increases the amount of holes which is not used for a combination of electrons and holes so that the organic layers of the light-emitting unit 500 are damaged, and the lifespan of the OLED apparatus 100 is shortened.

The first hole transporting layer 511 of the OLED apparatus 1000 according to one embodiment of the present disclosure is formed in the mixed structure including the first material 511a having the relatively-large hole mobility, and the second material 511b whose hole mobility is relatively lower than that of the first material 511a, to thereby facilitate the balance of electrons and holes. In consideration of the amount of injected electrons, a weight percent ratio of the first material 511a and the second material 511b in the first hole transporting layer 511 is adjusted so that the amount of electrons or holes is not unnecessarily increased in the light-emitting unit 500, to thereby improve the lifespan of the OLED apparatus 1000.

The second material 511b included in the first hole transporting layer 511 of the mixed structure is the material whose triplet energy level (T1) is relatively larger than that of the first material 511a, wherein the second material 511b reduces the transfer of the electrons from the first emission layer 512 to the first hole transporting layer 511. For example, the second material 511b has the triplet energy level (T1) within a range from about −2.7 eV to about −2.6 eV so that it is possible to reduce a diffusion of the electrons from the first emission layer 512 to the first hole transporting layer 511. That is, the first hole transporting layer 511 includes the second material 511b with the high triplet energy level (T1), whereby it is possible to reduce the damage of the first hole transporting layer 511 by the electron transferred from the first emission layer 512. In comparison to the single structure of the first hole transporting layer 511 having only the first material 511a with the relatively-low triplet energy level (T1), the mixed structure of the OLED apparatus according to one embodiment of the present disclosure enables to improve the lifespan of the OLED apparatus 1000.

In more detail, referring to FIG. 3, the triplet energy level (T1b) of the second material 511b is higher than the triplet energy level (T1a) of the first material 511a. In case of the single structure of the first hole transporting layer 511 having only the first material 511a with the relatively-low triplet energy level (T1a), the electrons may be transferred or diffused from the first emission layer 512 to the first hole transporting layer 511 by the difference between the triplet energy level (T1e) of the first emission layer 512 and the triplet energy level (T1a) of the first material 511a. The first hole transporting layer 511 may be damaged by the electrons transferred or diffused to the first hole transporting layer 511, whereby the lifespan of the OLED apparatus 1000 may be shortened.

According as the first hole transporting layer 511 of the OLED apparatus 1000 according to one embodiment of the present disclosure has the mixed structure including the second material 511b with the relatively-higher triplet energy level (T1b), it increases the difference with respect to the triplet energy level (T1e) of the first emission layer 512, in comparison to the single structure of the first hole transporting layer 511 having only the first material 511a. That is, the difference between the triplet energy level (T1e) of the first emission layer 512 and the triplet energy level (T1b) of the second material 511b is increased in comparison to the difference between the triplet energy level (T1e) of the first emission layer 512 and the triplet energy level (T1a) of the first material 511a so that it is possible to reduce the diffusion or transfer of the electrons from the first emission layer 512 to the first hole transporting layer 511.

Accordingly, it is possible to reduce the damage of the first hole transporting layer 511 by the electron, and furthermore, to improve the lifespan of the OLED apparatus 1000.

The second material 511b included in the first hole transporting layer 511 of the mixed structure is the material whose HOMO (highest occupied molecular orbitals) level is relatively lower than that of the first material 511a. The second material 511b minimizes an accumulation of the holes on the interface between the first hole transporting layer 511 and the first emission layer 512. For example, the second material 511b has the HOMO level within a range from about −5.2 eV to about −4.7 eV, to thereby reduce the accumulation of the holes on the interface between the first hole transporting layer 511 and the first emission layer 512. That is, if the HOMO level of the second material 511b of the first hole transporting layer 511 is relatively lower than the HOMO level of the first material 511a of the first hole transporting layer 511, it is possible to reduce the accumulation of the holes on the interface between the first hole transporting layer 511 and the first emission layer 512 for a process of supplying the holes from the first hole transporting layer 511 to the first emission layer 512. Accordingly, in comparison to the single structure of the first hole transporting layer 511 having only the first material 511a with the relatively-high HOMO level, the mixed structure of the OLED apparatus according to one embodiment of the present disclosure enables improvement of the lifespan of the OLED apparatus 1000.

In more detail, referring to FIG. 3, the HOMO level (Hb) of the second material 511b is relatively lower than the HOMO level (Ha) of the first material 511a. In the single structure of the first hole transporting layer 511 having only the first material 511a with the relatively-high HOMO level (Ha), some of holes may be accumulated on the interface between the first hole transporting layer 511 and the first emission layer 512 by the difference between the HOMO level (He) of the first emission layer 512 and the HOMO level (Ha) of the first material 511a for the process of supplying the holes from the first hole transporting layer 511 to the first emission layer 512. Accordingly, the lifespan of the OLED apparatus 1000 may be shortened due to deterioration on the interface between the first hole transporting layer 511 and the first emission layer 512.

The first emission layer 512 is in direct contact with the first hole transporting layer 511, wherein the first emission layer 512 may be referred to as an adjoining-organic layer. Also, if an additional organic layer (for example, additional hole transporting layer) provided between the first emission layer 512 and the first hole transporting layer 511 is in contact with the first hole transporting layer 511, it is possible to minimize the accumulation of holes on the interface between the first hole transporting layer 511 and the additional organic layer. In this case, the additional organic layer is in direct contact with the first hole transporting layer 511, wherein the additional organic layer may be referred to as an adjoining-organic layer.

As the first hole transporting layer 511 of the OLED apparatus 1000 according to one embodiment of the present disclosure has the mixed structure including the second material 511b with the relatively-low HOMO level (Hb), it decreases the difference with respect to the HOMO level (He) of the first emission layer 512, in comparison to the single structure of the first hole transporting layer having only the first material 511a. That is, the difference between the HOMO level (He) of the first emission layer 512 and the HOMO level (Hb) of the second material 511b is reduced in comparison to the difference between the HOMO level (He) of the first emission layer 512 and the HOMO level (Ha) of the first material 511a so that it is possible to minimize the accumulation of holes on the interface between the first hole transporting layer 511 and the adjoining-organic layer disposed close to the first hole transporting layer 511 for a process of transferring the holes from the first hole transporting layer 511 to the first emission layer 512. Accordingly, it is possible to reduce deterioration on the interface between the first hole transporting layer 511 and the adjoining-organic layer disposed close to the first hole transporting layer 511 by the accumulated holes, to thereby improve the lifespan of the OLED apparatus 1000.

The second material 511b included in the first hole transporting layer 511 of the mixed structure is the material whose thermal stability is relatively higher than that of the first material 511a, wherein the second material 511b improves durability of the first hole transporting layer 511. Accordingly, in comparison to the single structure of the first hole transporting layer 511 having only the first material 511a, the mixed structure enables improvement of the lifespan of the OLED apparatus 1000. The respective thermal stabilities of the first material 511a and the second material 511b may be compared through various methods. For example, a purity change rate of the first material 511a may be compared with a purity change rate of the second material 511b, wherein the purity change rate indicates the rate of damage in each of the first and second materials 511a and 511b after each of the first and second materials 511a and 511b is maintained at a predetermined temperature for a predetermined time period. In detail, the first material 511a and the second material 511b are maintained at about 250° C. for about at least 250 hours in consideration of the temperature in the environment for the deposition of the first hole transporting layer 511 and the minimum time of the material maintained inside a deposition apparatus, and then the purity change rate of the first material 511a is compared with the purity change rate of the second material 511b. In order to improve durability of the first hole transporting layer 511, the material purity change rate of the second material 511b is about 5% or less than 5%.

As described above, the first hole transporting layer 511 of the OLED apparatus 1000 according to one embodiment of the present disclosure has the mixed structure including the first material 511a and the second material 511b so that the mixed structure enables to realize the low driving voltage, improved light-emission efficiency and increased lifespan in comparison to the single structure. Also, it is possible to realize the low driving voltage, improved light-emission efficiency and increased lifespan in the OLED apparatus 1000 by optimizing a weight percentage (wt %) ratio of the first material 511a and the second material 511b included in the first hole transporting layer 511 of the mixed structure. A weight percent of the first material 511a included in the first hole transporting layer 511 is higher than a weight percent of the second material 511b included in the first hole transporting layer 511.

The first material 511a of the first hole transporting layer 511 is the material with the relatively-high hole mobility, wherein the first material 511a improves the light-emission efficiency of the OLED apparatus 1000 and lowers the driving voltage of the OLED apparatus 1000. That is, as the weight percent of the first material 511a included in the first hole transporting layer 511 becomes higher, the light-emission efficiency and the driving voltage properties of the OLED apparatus 1000 are improved, however, the lifespan of the OLED apparatus is reduced, in comparison to the single structure of the first hole transporting layer 511 having only the second material 511b.

The second material 511b of the first hole transporting layer 511 is the material whose triplet energy level (T1) is relatively high, HOMO level is relatively low and thermal stability is relatively high, wherein the second material 511b improves the lifespan of the OLED apparatus 1000. That is, according as the weight percent of the second material 511b included in the first hole transporting layer 511 becomes higher, the lifespan of the OLED apparatus 1000 is improved, however, the light-emission efficiency and the driving voltage properties are reduced, in comparison to the single structure of the first hole transporting layer 511 having only the first material 511a. Also, if the amount of the second material 511b included in the first hole transporting layer 511 is larger than the amount of the first material 511a included in the first hole transporting layer 511, the light-emission efficiency and the driving voltage properties may be reduced excessively.

Accordingly, on the assumption that the weight total of the first material 511a and the second material 511b included in the first hole transporting layer 511 of the mixed structure is 100 wt %, the first material 511a is within range from 50 wt % to 90 wt %, and the second material 511b is within a range from 10 wt % to 50 wt %, to thereby optimize the weight percent ratio of the first material 511a to the second material 511b. Accordingly, it is possible to maintain the driving voltage properties and the light-emission efficiency of the OLED apparatus 1000, or to minimize the reduction of the driving voltage properties and the light-emission efficiency of the OLED apparatus 1000, and simultaneously to improve the lifespan of the OLED apparatus 1000.

In the OLED apparatus 1000 according to one embodiment of the present disclosure, the first hole transporting layer 511 has the mixed structure including the first material 511a and the second material 511b, wherein the hole mobility and energy level of the first material 511a is different from the hole mobility and energy level of the second material 511b. Thus, in comparison to the single structure of the first hole transporting layer 511 having only the first material 511a or only the second material 511b, the mixed structure enables to realize the properties of high efficiency and long lifespan of the OLED apparatus 1000.

Referring to FIG. 2, among the plurality of stacks 510, 520 and 530 disposed between the anode 400 and the cathode 600, the first stack 510 which is disposed closest to the anode 400 includes the first hole transporting layer 511, the first emission layer 512, and the first electron transporting layer 513, as described above. The second stack 520 is disposed on the first stack 510, wherein the second stack 520 includes the second hole transporting layer 521, the second emission layer 522, and the second electron transporting layer 523. Also, the third stack 530 is disposed on the second stack 520, wherein the third stack 530 includes the third hole transporting layer 531, the third emission layer 532, and the third electron transporting layer 533.

The plurality of emission layers 512, 522 and 532 included in the light-emitting unit 500 are configured to emit white light obtained by mixing the light emitted from each of the plurality of emission layers 512, 522 and 532. For example, blue light is emitted from the first stack 510 and the third stack 530, yellow-green light is emitted from the second stack 520, and the white light obtained by mixing the blue light and the yellow-green light is emitted from the light-emitting unit 500. In this case, a peak wavelength of the light emitted from the first emission layer 512 of the first stack 510 is within a range from 440 nm to 480 nm, a peak wavelength of the light emitted from the third emission layer 532 of the third stack 530 is within a range from 440 nm to 480 nm, and a peak wavelength of the light emitted from the second emission layer 522 of the second stack 520 is within a range from 540 nm to 580 nm.

The second stack 520 may further include an additional emission layer for emitting green light or red light. If the second stack 520 includes the second emission layer 522 for emitting the yellow-green light, and the additional emission layer for emitting the green light, a peak wavelength of the light emitted from the second stack 520 is within a range from 510 nm to 570 nm. Also, if the second stack 520 includes the second emission layer 522 for emitting the yellow-green light, and the additional emission layer for emitting the red light, a peak wavelength of the light emitted from the second stack 520 is within a range from 540 nmm to 650 nm.

The second hole transporting layer 521 included in the second stack 520 and the third hole transporting layer 531 included in the third stack 530 respectively transfer the hole, which is supplied from the anode 400 or the charge generation layers 540 and 550, to the second emission layer 522 and the third emission layer 533. In the same manner as the aforementioned first hole transporting layer 511, the second hole transporting layer 521 and the third hole transporting layer 531 may be formed in the mixed structure having the two materials whose properties are different from each other in consideration the structure of the light-emitting unit 500 and the amount of electron injected into the inside of the light-emitting unit 500. Accordingly, it is possible to lower the driving voltage of the OLED apparatus 1000, and to improve the lifespan and the light-emission efficiency of the OLED apparatus 1000.

Also, the first hole transporting layer 511 may have a thickness from about 70 nm to about 150 nm so as to optimize a micro-cavity effect of the light emitted from the first emission layer 512 by a distance between the anode 400 and the cathode 600. Herein, the micro-cavity indicates that the light-emission efficiency is improved by amplification and constructive interference of the light with a specific wavelength through repetitive reflection and re-reflection of the light emitted from the emission layer between the two electrodes 400 and 600. Also, if the thickness of the first hole transporting layer 511 is less than about 70 nm, the first hole transporting layer 511 does not function as a hole transporting layer. Meanwhile, if the thickness of the first hole transporting layer 511 is more than about 150 nm, the driving voltage is raised due to the excessive thickness of the first hole transporting layer 511, or it is impossible to maximize a micro-cavity effect between the anode 400 and the cathode 600.

The first electron transporting layer 513 included in the first stack 510, the second electron transporting layer 523 included in the second stack 520, and the third electron transporting layer 533 included in the third stack 530 respectively transfer the electron, which is supplied from the cathode 600 or the charge generation layer 540 and 550, to the first emission layer 512, the second emission layer 522, and the third emission layer 532.

The first charge generation layer 540 disposed between the first stack 510 and the second stack 520, and the second charge generation layer 550 disposed between the second stack 520 and the third stack 530 inject the electron and hole to the first emission layer 512, the second emission layer 522, or the third emission layer 523. Each of the first charge generation layer 540 and the second charge generation layer 550 is formed in the structure including N-type charge generation layer and P-type charge generation layer connected with each other. In this case, the N-type charge generation layer supplies the electron to the emission layer disposed close to the anode 400, for example, the first emission layer 512 and the second emission layer 522. Also, the P-type charge generation layer supplies the hole to the emission layer disposed close to the cathode 600, for example, the second emission layer 522 and the third emission layer 532. Accordingly, the light-emission efficiency of the OLED apparatus 1000 including the plurality of emission layers is improved, and the driving voltage thereof is lowered.

Figures 4, 5:
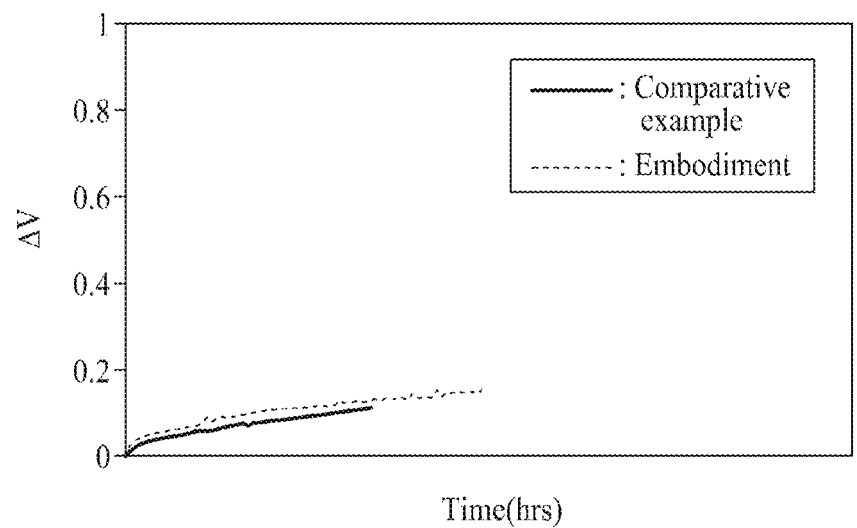
FIG. 4 is a table showing a driving voltage and a light-emission efficiency in an OLED apparatus according to a comparative example, and the OLED apparatus according to one embodiment of the present disclosure.
FIG. 5 is a graph showing the change of driving voltage in accordance with the time in the OLED apparatus according to the comparative example and the OLED apparatus according to one embodiment of the present disclosure.
Figure 6A:
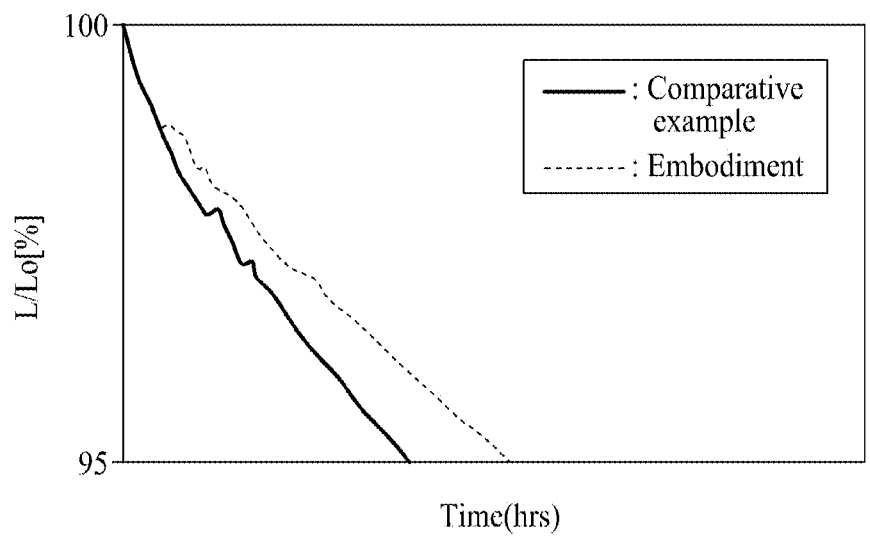
FIGS. 6A and 6B are graphs showing lifespan in the OLED apparatus according to the comparative example and the OLED apparatus according to one embodiment of the present disclosure.
Figure 6B:
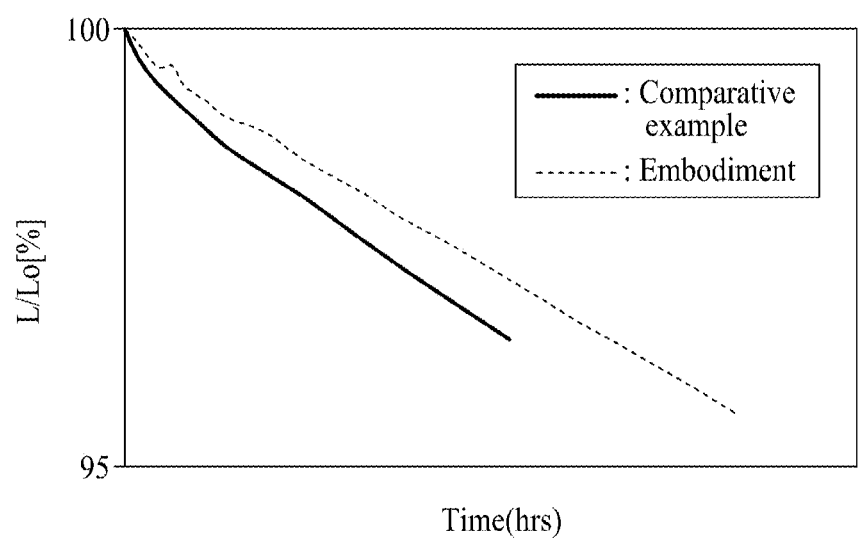

FIG. 4 is a table showing the driving voltage and light-emission efficiency in an OLED apparatus according to a comparative example and the OLED apparatus according to one embodiment of the present disclosure. FIG. 5 is a graph showing the change of driving voltage in accordance with the time in the OLED apparatus according to the comparative example and the OLED apparatus according to one embodiment of the present disclosure. FIGS. 6A and 6B are graphs showing the lifespan in the OLED apparatus according to the comparative example and the OLED apparatus according to one embodiment of the present disclosure.

In case of the comparative example shown in FIGS. 4 to 6, the OLED apparatus is provided with a hole transporting layer of a single structure. In detail, the OLED apparatus of the comparative example corresponds to the OLED apparatus described with reference to FIGS. 2 and 3 which includes the first hole transporting layer having only the first material with the relatively-large hole mobility.

In case of the embodiment shown in FIGS. 4 to 6, the OLED apparatus is provided with a hole transporting layer of a mixed structure. In detail, the OLED apparatus of the embodiment corresponds to the OLED apparatus described with reference to FIGS. 2 and 3 which includes the first hole transporting layer having the first material with the relatively-large hole mobility and the second material with the relatively-high triplet energy level. Also, on the assumption that the weight total of the first material and the second material included in the first hole transporting layer of the embodiment is 100 wt %, the first material is about 90 wt %, and the second material is about 10 wt %. In other words, the ratio of the first material to the second material in the first hole transporting layer is at about 9:1.

Referring to FIG. 4, when a current of 10 mA/cd is supplied to each structure of the comparative example and the embodiment, the driving voltage of the comparative example is 11.5V, and luminance showing the light-emission efficiency is 23.41 m/W. In case of the embodiment, the driving voltage is 11.6V, and the luminance is 23.21 m/W. That is, the driving voltage and the light-emission efficiency in the comparative example including the first hole transporting layer having only the first material with the relatively-large hole mobility is very similar to the driving voltage and the light-emission efficiency in the embodiment including the first hole transporting layer having the first material with the relatively-large hole mobility and the second material with the relatively-low hole mobility.

FIG. 5 is a graph showing the change of driving voltage in accordance with the time in the OLED apparatus according to the comparative example and the OLED apparatus according to one embodiment of the present disclosure. In more detail, FIG. 5 shows the change of driving voltage in accordance with the time with respect to an initial driving voltage. Referring to FIG. 5, the change of driving voltage in accordance with the time in the comparative example including the first hole transporting layer having only the first material is very similar to the change of driving voltage in accordance with the time in the embodiment including the first material and the second material.

FIGS. 6A and 6B are graphs showing the lifespan in the OLED apparatus according to the comparative example and the OLED apparatus according to one embodiment of the present disclosure. On the assumption that an initial luminance is 100%, FIGS. 6a and 6B show the time taken until the initial luminance is reduced to 95%.

FIG. 6A is the graph showing the lifespan when the blue light is emitted from the OLED apparatus. Referring to FIG. 6A, in case of the embodiment including the first hole transporting layer having the first material and the second material mixed together, it takes more time until the luminance is reduced from 100% to 95%, in comparison to the comparative example including the first hole transporting layer having only the first material.

FIG. 6B is the graph showing the lifespan when the yellow-green light is emitted from the OLED apparatus. Referring to FIG. 6B, in case of the embodiment including the first hole transporting layer having the first material and the second material mixed together, it takes more time until the luminance is reduced from 100% to 95%, in comparison to the comparative example including the first hole transporting layer having only the first material.

Thus, referring to FIGS. 4 to 6, the first hole transporting layer of the OLED apparatus according to one embodiment of the present disclosure, which is formed in the mixed structure including the first material with the relatively-large hole mobility, and the second material whose triplet energy level is relatively high, HOMO level is relatively low, and thermal stability is relatively high, enables to realize the lower driving voltage, the more-improved light-emission efficiency, and the more-increased lifespan, in comparison to the first hole transporting layer of the OLED apparatus according to the comparative example formed in the single structure including only the first material.

Figure 7:
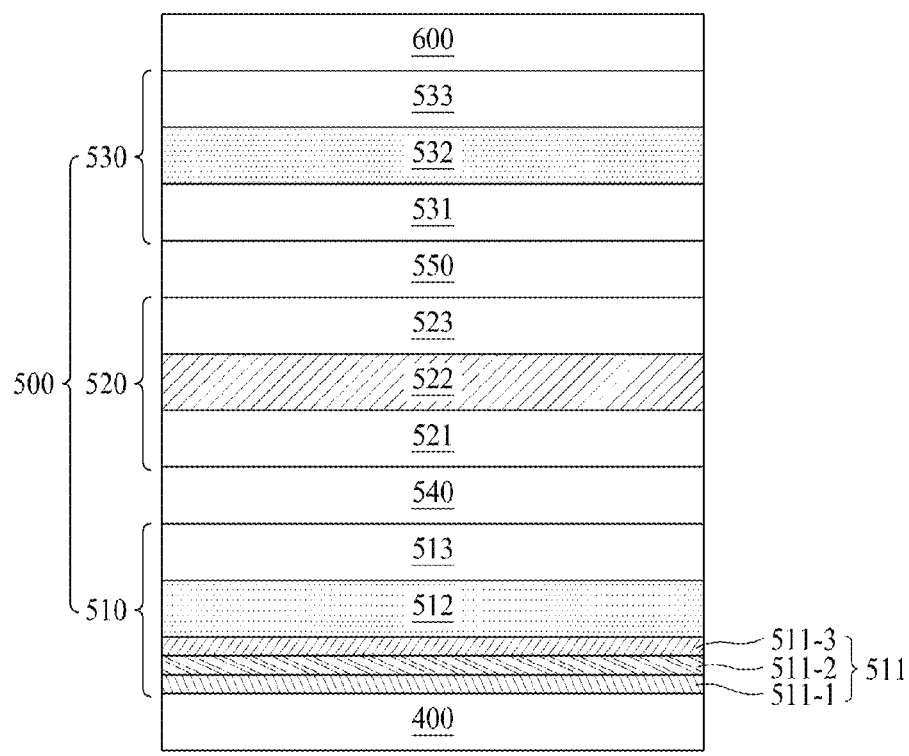
FIG. 7 is a cross sectional view illustrating the components of an OLED apparatus according to another embodiment of the present disclosure.

FIG. 7 is a cross sectional view illustrating the components of an OLED apparatus 2000 according to another embodiment of the present disclosure. Except a structure of a first hole transporting layer 511, the OLED apparatus 2000 according to another embodiment of the present disclosure shown in FIG. 7 is the same as the OLED apparatus 1000 according to one embodiment of the present disclosure, whereby a detailed description for the same parts or similar parts will be omitted.

In the OLED apparatus 2000 according to another embodiment of the present disclosure, the first hole transporting layer 511 includes a mixed layer including first and second materials mixed together, and a non-mixed layer including only the first or second material. In more detail, referring to FIG. 7, the first hole transporting layer 511 includes a first non-mixed layer 511-1, a mixed layer 511-2, and a second non-mixed layer 511-3.

The first non-mixed layer 511-1 is disposed relatively close to an anode 400, wherein the first non-mixed layer 511-1 is a single layer having only the first material with a large hole mobility. The first non-mixed layer 511-1 functions as a buffer layer between the anode 400 and the mixed layer 511-2. Also, the first non-mixed layer 511-1 helps a transfer of holes supplied or transmitted from the anode 400. The first material has the hole mobility of about $1\times10^{-4}$ $cm^2/Vs$ or more than $1\times10^{-4}$ $cm^2/Vs$, to thereby improve a hole transfer capacity to the OLED apparatus 2000.

The second non-mixed layer 511-3 is disposed relatively close to a first emission layer 512, wherein the second non-mixed layer 511-2 corresponds to a layer having a single structure having only the second material whose triplet energy level (T1) is relatively high, HOMO level is relatively low, and thermal stability is relatively high. The second non-mixed layer 511-2 functions as a buffer layer between the first emission layer 512 and the mixed layer 511-2. Also, the second non-mixed layer 511-3 prevents a transfer of electrons from the first emission layer 512. The second material 511*b* has the triplet energy level (T1) within a range from about −2.7 eV to about −2.6 eV so that it is possible to reduce a diffusion of the electrons from the first emission layer 512. Also, the second material 511*b* has the HOMO level within a range from about −5.2 eV to about −4.7 eV, to thereby reduce an accumulation of the holes on the interface between the first hole transporting layer 511 and the first emission layer 512.

The mixed layer 511-2 is disposed between the first non-mixed layer 511-1 and the second non-mixed layer 511-3. The mixed layer 511-2 corresponds to a layer having a mixed structure with the first and second materials. The mixed layer 511 includes the first material with the relatively-large hole mobility, and the second material whose triplet energy level (T1) is relatively high, HOMO level is relatively low, and thermal stability is relatively high. Accordingly, a balance of the electrons and holes is maintained in a light-emitting unit 500 so that it is possible to realize the lower driving voltage and the more-improved light-emission efficiency of the OLED apparatus 2000, in comparison to the hole transporting layer having the single structure. In addition, it is possible to overcome the problems relating the injection of electron into the first hole transporting layer 511 and the accumulation of holes on the interface of the first hole transporting layer 511, whereby the lifespan of the OLED apparatus 2000 according to another embodiment of the present disclosure is increased in comparison to that of the hole transporting layer having the single structure.

Also, on the assumption that the weight total of the first material and the second material included in the mixed layer 511-2 is 100 wt %, the first material is within range from 50 wt % to 90 wt %, and the second material is within a range from 10 wt % to 50 wt %, to thereby optimize the weight percent ratio of the first material to the second material. Accordingly, it is possible to realize the lower driving voltage, the improved light-emission efficiency, and the increased lifespan in the OLED apparatus 2000 according to another embodiment of the present disclosure.

The first hole transporting layer 511 in the OLED apparatus 2000 according to another embodiment of the present disclosure is obtained by additionally providing the non-mixed layers 511-1 and 511-3 to the first hole transporting layer of the OLED apparatus shown in FIG. 2, however, a total thickness of the first hole transporting layer 511 is not increased. That is, the total thickness of the first non-mixed layer 511-1, the mixed layer 511-2, and the second non-mixed layer 511-3 is within a range from about 70 nm to about 150 nm. If the thickness of the first hole transporting layer 511 is less than about 70 nm, the first hole transporting layer 511 does not function as a hole transporting layer. Meanwhile, if the thickness of the first hole transporting layer 511 is more than about 150 nm, the driving voltage is raised due to the excessive thickness of the first hole transporting layer 511, or it is impossible to maximize a micro-cavity effect.

The thickness of each of the first non-mixed layer 511-1 and the second non-mixed layer 511-3 is about 40% or less than 40% in comparison to the thickness of the mixed layer 511-2. If the thickness of each of the first non-mixed layer 511-1 and the second non-mixed layer 511-3 is more than 40% in comparison to the thickness of the mixed layer 511-2, the thickness of the mixed layer 511-2 is relatively smaller so that the properties of driving voltage, light-emission efficiency and lifespan of the OLED apparatus may be deteriorated.

Figure 8:
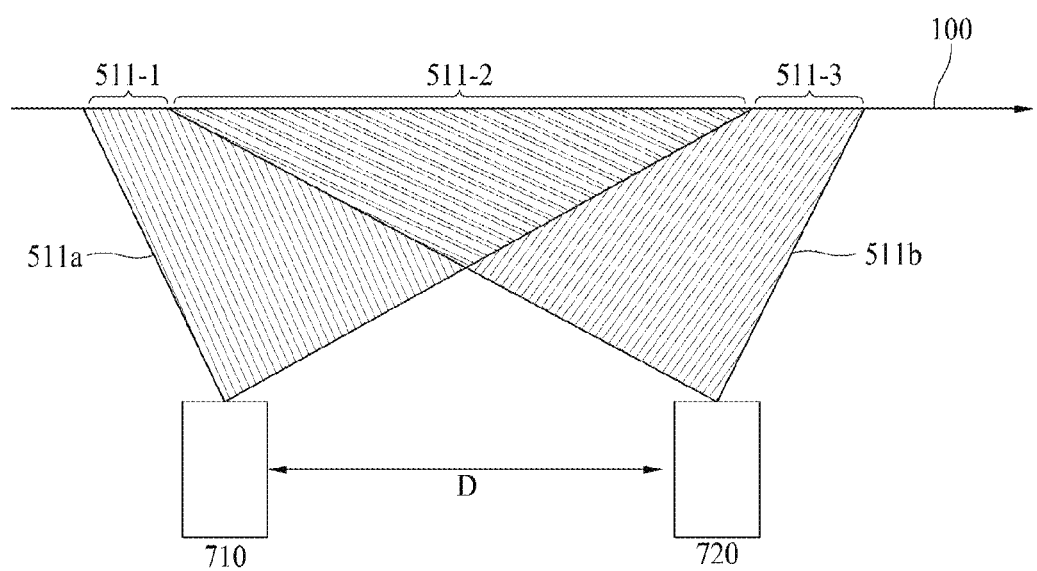
FIG. 8 illustrates a co-deposition method for manufacturing a hole transporting layer of FIG. 7.

FIG. 8 illustrates a co-deposition method for manufacturing the hole transporting layer of FIG. 7.

Referring to FIG. 8, the first hole transporting layer 511 of the OLED apparatus 2000 according to another embodiment of the present disclosure may be manufactured by the co-deposition method. In more detail, a first evaporator 710 provided with the first material 511*a* and a second evaporator 720 provided with the second material 511*b* are disposed at a lower side of a chamber, and a substrate 100, on which the first hole transporting layer is to be formed, is disposed at an upper side of the chamber, wherein one surface of the substrate 100 for the first hole transporting layer to be formed thereon confronts the evaporators 710 and 720. Then, if the substrate 100 is moved along a direction of the chamber, the first material 511*a* and the second material 511*b* are evaporated from the first evaporator 710 and the second evaporator 720. According to the movement of the substrate, the first material 511*a* evaporated from the first evaporator 710 is deposited on the substrate 100, to thereby form the first non-mixed layer 511-1. Then, the first material 511*a* and the second material 511*b* are evaporated together from the first evaporator 710 and the second evaporator 720, to thereby form the mixed layer 511-2. Thereafter, the second material 511*b* evaporated from the second evaporator 720 is deposited on the substrate 100, to thereby form the second non-mixed layer 511-3.

The thickness of each of the first non-mixed layer 511-1, the mixed layer 511-2, and the second non-mixed layer 511-3 may be adjusted by a distance (D) between the first evaporator 710 and the second evaporator 720. For example, according as the distance (D) between the first evaporator 710 and the second evaporator 720 is increased, the first non-mixed layer 511-1 and the second non-mixed layer 511-3 are increased in thickness, and the mixed layer 511-2 is decreased in thickness.

Also, a ratio of the first material 511*a* to the second material 511*b* in the mixed layer 511-2 may be adjusted by a deposition speed (nm/s) of the first evaporator 710 and the second evaporator 720. For example, if the deposition speed of the first evaporator 710 is higher than the deposition speed of the second evaporator 720, a percentage of the first material 511*a* is higher than a percentage of the second material 511*b*.

If the distance (D) between the first evaporator 710 and the second evaporator 720 is decreased, it is possible to manufacture the first hole transporting layer 511 having only the mixed layer of the first material 511*a* and the second material 511*b*. That is, it is possible to manufacture the first hole transporting layer of the single structure of the aforementioned OLED apparatus shown in FIG. 2. According to a design of the OLED apparatus, it is possible to include any one of the first non-mixed layer 511-1 and the second non-mixed layer 511-3.

Figure 9:
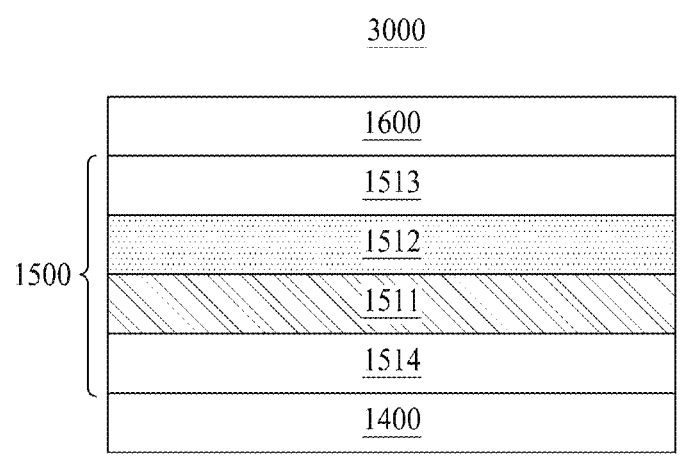
FIG. 9 is a cross sectional view illustrating the components of an OLED apparatus according to another embodiment of the present disclosure.

FIG. 9 is a cross sectional view illustrating the components of an OLED apparatus 3000 according to another embodiment of the present disclosure.

Referring to FIG. 9, the OLED apparatus 3000 according to another embodiment of the present disclosure may include an anode 1400, a cathode 1600, and a light-emitting unit 1500 disposed between the anode 1400 and the cathode 1600. The light-emitting unit 1500 may include a hole injecting layer 1514, a hole transporting layer 1511, an emission layer 1512, and an electron transporting layer 1513.

The light-emitting unit 1500 of the OLED apparatus 3000 according to another embodiment of the present disclosure, which is shown in FIG. 9, has a patterned emission layer structure, and emits mono-colored light. In case of the light-emitting unit 1500 of the patterned emission layer structure, each of emission layers for different color light emissions, for example, red, green and blue emission layers is separated by each pixel, and each pixel emits mono-colored light. Each emission layer may be patterned by the use of mask with an open area by each pixel, for example, FMM (fine metal mask). For convenience of explanation, FIG. 9 shows only one pixel.

The anode 1400 is separately disposed for each pixel (P). The anode 1400 is an electrode for supplying or transmitting holes to the light-emitting unit 1500, and the anode 1400 is connected with a source or drain electrode of a thin film transistor. The anode 1400 may be formed of a transparent layer of TCO (transparent conductive oxide) material such as ITO (indium tin oxide) or IZO (indium zinc oxide).

The cathode 1600 is disposed on the light-emitting unit 1500, wherein the cathode 1600 is an electrode for supplying or transmitting electrons to the light-emitting unit 1500. The cathode 1600 may be formed of a metal material such as silver (Ag), magnesium (Mg), silver-magnesium (Ag—Mg), and etc., or TCO (transparent conductive oxide) material such as ITO (indium tin oxide) or IZO (indium zinc oxide).

The hole injecting layer 1514 is disposed on the anode 1400, wherein the hole injecting layer 1514 is provided to smoothly inject the hole from the anode 1400 to the emission layer 1512. The hole injecting layer 1514 may be formed of at least any one selected from a group of CuPc(copperphthalocyanine), PEDOT(poly(3,4)-ethylenedioxythiophene), PANI(polyaniline), and NPD(N,N-bis(naphthalene-1-yl)-N, N'-bis(phenyl)-2,2'-dimethylbenzidine), but not limited to these materials.

The hole transporting layer 1511 is disposed on the hole injecting layer 1514, wherein the hole transporting layer 1511 is provided to smoothly transfer the holes, which is transmitted or supplied from the anode 1400, to the emission layer 1512.

The hole transporting layer 1511 is formed in a single layer of a mixed structure including two materials having the different properties, for example, first and second materials. For improvement of the hole transfer to the emission layer 1512, the first material of the hole transporting layer 1511 has a relatively-large hole mobility in comparison to the second material. For reducing a diffusion of the electrons from the emission layer 1512, the second material of the hole transporting layer 1511 has a relatively-high triplet energy level (T1) in comparison to the first material. For minimizing an accumulation of the holes on the interface between the hole transporting layer 1511 and the emission layer 1512, the second material of the hole transporting layer 1511 has a relatively-low HOMO level in comparison to the first material. For improving durability of the hole transporting layer 1511, the second material has a relatively-high thermal stability.

The hole transporting layer 1511 of the OLED apparatus 3000 according to another embodiment of the present disclosure has the mixed structure of the first material and the second material so that it is possible to realize lower driving voltage, improved light-emission efficiency, and increased lifespan in comparison to the single structure including only the first or second material.

The emission layer 1512 may be formed of a phosphorescent or fluorescent material for emitting mono-colored light. For example, the emission layer 1512 may be formed of a material for emitting red, green or blue light. If the emission layer 1512 emits the red light, a peak wavelength of the light emitted from the emission layer 1512 is within a range from 600 nm to 650 nm. If the emission layer 1512 emits the green light, a peak wavelength of the light emitted from the emission layer 1512 is within a range from 510 nm to 570 nm. If the emission layer 1512 emits the blue light, a peak wavelength of the light emitted from the emission layer 1512 is within a range from 440 nm to 480 nm.

If the emission layer 1512 emits the red light, the emission layer 1512 may be formed of a phosphorescent material including a host material of CBP(4,4'-bis(carbazol-9-yl) biphenyl), and dopant including at least any one selected from a group of Ir(PIQ)2(acac)(bis(1-phenylisoquinoline) acetylacetonate iridium(III)), Ir(PIQ)3(tris(1-phenylquinoline)iridium(III) and PtOEP(octaethylporphine platinum). The emission layer 1512 may be formed of a fluorescent material including PBD:Eu(DBM)3(Phen) or Perylene, but not limited to these materials.

If the emission layer 1512 emits the green light, the emission layer 1512 may be formed of a phosphorescent material including a host material of CBP(4,4'-bis(carbazol-9-yl)biphenyl), and dopant including an iridium-based material, or may be formed of a fluorescent material including Alq3(tris(8-hydroxyquinolino)aluminum), but not limited to these materials.

If the emission layer 1512 emits the blue light, the emission layer 1512 may be formed of a phosphorescent material including a host material of CBP(4,4'-bis(carbazol-9-yl)biphenyl), and dopant including an iridium-based material, or may be formed of a fluorescent material including any one selected from a group of spiro-BDAVBi(2,7-bis)4-diphenylamino)styryl)-9,9-spirofluorene), spiro-CBP(2,2',7, 7'-tetrakis(carbozol-9-yl)-9,9-spirofluorene), distyrylbenzene (DSB), distyrylarylene (DSA), PFO(polyfluorene)-based polymer, and PPV(polyphenylenevinylene)-based polymer, but not limited to these materials.

Figure 10A:
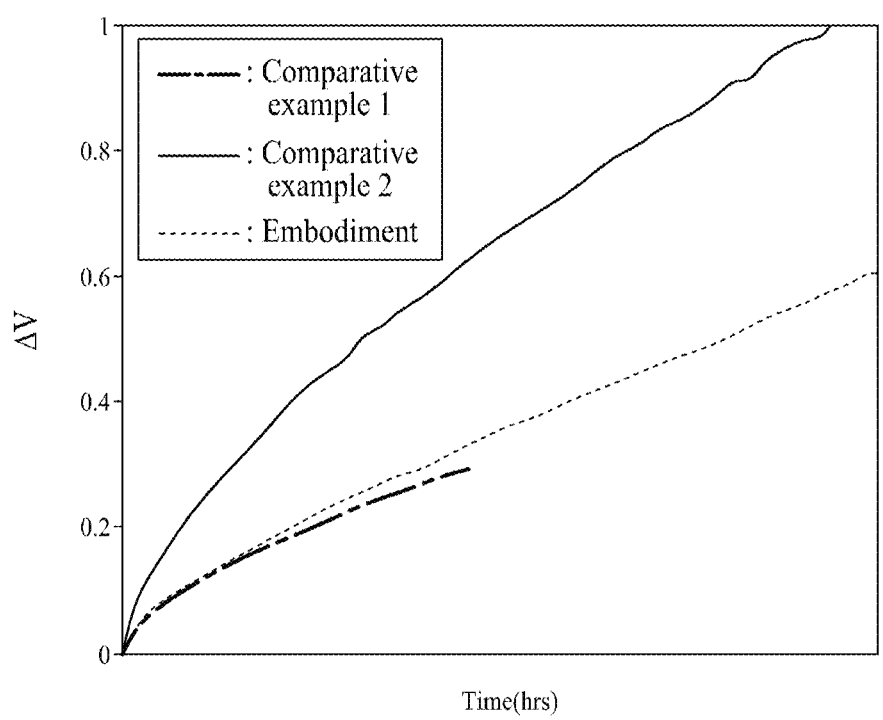
FIG. 10A is a graph showing the change of driving voltage in accordance with the time in an OLED apparatus according to a comparative example and the OLED apparatus according to another embodiment of the present disclosure.
Figure 10B:
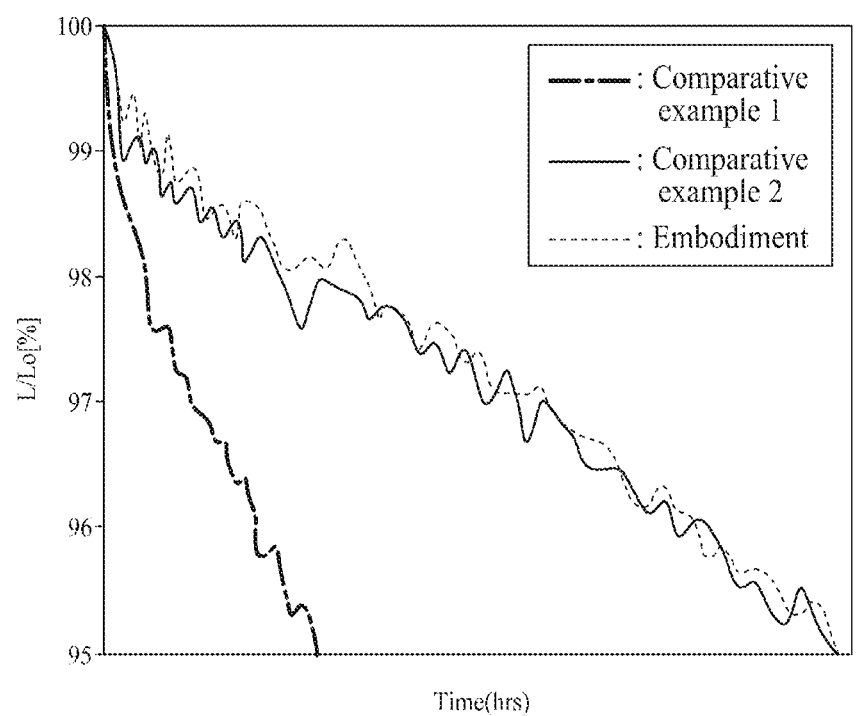
FIG. 10B is a graph showing the lifespan in accordance with the time in the OLED apparatus according to the comparative example and the OLED apparatus according to another embodiment of the present disclosure.

FIG. 10A is a graph showing the change of driving voltage in accordance with the time in the OLED apparatus according to comparative example and the OLED apparatus according to another embodiment of the present disclosure. FIG. 10B is a graph showing the lifespan in accordance with the time in the OLED apparatus according to the comparative example and the OLED apparatus according to another embodiment of the present disclosure.

In case of the comparative example 1 shown in FIGS. 10A and 10B, the OLED apparatus is provided with a hole transporting layer of a single structure having only the first material. In detail, the OLED apparatus of the comparative example 1 corresponds to the OLED apparatus 3000 described with reference to FIG. 9 which includes the hole transporting layer having only the first material with the relatively-large hole mobility.

In case of the comparative example 2 shown in FIGS. 10A and 10B, the OLED apparatus is provided with a hole transporting layer of a single structure having only the second material. In detail, the OLED apparatus of the comparative example 2 corresponds to the OLED apparatus 3000 described with reference to FIG. 9 which includes the hole transporting layer having only the second material whose triplet energy level (T1) is relatively high and HOMO level is relatively low.

In case of the embodiment shown in FIGS. 10A and 10B, the OLED apparatus is provided with a hole transporting layer of a mixed structure. In detail, the OLED apparatus of the embodiment corresponds to the OLED apparatus described with reference to FIG. 9 which includes the hole transporting layer having the first material with the relatively-large hole mobility and the second material with the relatively-high triplet energy level. Also, on the assumption that the weight total of the first material and the second material included in the hole transporting layer of the embodiment is 100 wt %, the first material is about 50 wt %, and the second material is about 50 wt %. In other words, the ratio of the first material to the second material in the hole transporting layer is at 5:5.

FIG. 10A is the graphs showing the change of driving voltage in accordance with the time in the comparative example 1, the comparative example 2, and the embodiment. In more detail, FIG. 10A is the graph showing the change of driving voltage in accordance with the time with respect to an initial driving voltage. Referring to FIG. 10A, in case of the comparative example 2 having only the second material, the driving voltage is largely changed in accordance with the time, in comparison to the comparative example 1 having only the first material. Also, the change of driving voltage in the embodiment having the first material and the second material is very similar to the change of driving voltage in the comparative example 1 having only the first material. That is, the driving voltage property in the hole transporting layer of the single structure having only the first material with the relatively-large hole mobility is greater than the driving voltage property in the hole transporting layer of the single structure having only the second material with the relatively-high triplet energy level (T1). Also, the driving voltage property in the hole transporting layer of the mixed structure having the first material and the second material which are mixed at a ratio of about 5:5 is very similar to the driving voltage property in the hole transporting layer of the single structure having only the first material, and the driving voltage property in the hole transporting layer of the mixed structure having the first material and the second material which are mixed at a ratio of about 5:5 is improved in comparison to the driving voltage property in the hole transporting layer of the single structure having only the second material.

FIG. 10B is the graph showing the lifespan in accordance with the time in the comparative example 1, the comparative example 2, and the embodiment. On the assumption that an initial luminance is 100%, FIG. 10B is the graph showing the time taken until the initial luminance is reduced to 95%.

Referring to FIG. 10B, the time taken until the initial luminance is reduced to 95% in the comparative example 2 having only the second material is longer than the time taken until the initial luminance is reduced to 95% in the comparative example 1 having only the first material. Also, the time taken until the initial luminance is reduced to 95% in the comparative example 2 having only the second material is very similar to the time taken until the initial luminance is reduced to 95% in the embodiment having the first material and the second material. That is, in case of the hole transporting layer of the single structure having only the second material whose triplet energy level (T1) is relatively high, HOMO level is relatively low, and thermal stability is relatively high, the lifespan property is greater in comparison to the hole transporting layer of the single structure having only the first material with the relatively-large hole mobility. Also, the lifespan property in the hole transporting layer of the mixed structure having the first material and the second material which are mixed at a ratio of about 5:5 is very similar to the lifespan property in the hole transporting layer of the single structure having only the second material, and the lifespan property in the hole transporting layer of the mixed structure having the first material and the second material which are mixed at a ratio of about 5:5 is improved in comparison to the lifespan property in the hole transporting layer of the single structure having only the first material.

As described above, if the OLED apparatus has the common emission layer structure for emitting the white light, or the patterned emission layer structure for emitting the mono-colored light, the hole transporting layer disposed between the two electrodes is formed in the mixed structure including the two materials whose properties are different from each other, to thereby realize the lower driving voltage, the improved light-emission efficiency, and the increased lifespan of the OLED apparatus.

The hole transporting layer of the OLED apparatus according to one embodiment of the present disclosure is formed in the mixed structure having the first material with the relatively-large hole mobility, and the second material with the relatively-high triplet energy level, to thereby realize the low driving voltage, improved light-emission efficiency, and increased lifespan of the OLED apparatus.

The hole transporting layer of the mixed structure includes the first material with the relatively-large hole mobility in comparison to the second material, whereby the transfer of holes becomes easier. Thus, in comparison to the hole transporting layer of the single structure having only the second material, the hole transporting layer of the mixed structure having the first material and the second material enables to lower the driving voltage, and to improve the light-emission efficiency.

The hole transporting layer of the mixed structure includes the second material with the relatively-high triplet energy level in comparison to the first material, whereby it is possible to reduce the damage of hole transporting layer by the electron transferred or diffused from the emission layer to the hole transporting layer. Thus, in comparison to the hole transporting layer of the single structure having only the first material, the hole transporting layer of the mixed structure having the first material and the second material enables to increase the lifespan of the OLED apparatus.

As the HOMO level of the second material included in the hole transporting layer of the mixed structure is lower than the HOMO level of the first material, it is possible to minimize the accumulation of holes on the interface between the hole transporting layer and the adjoining-organic layer, that is, to minimize the deterioration thereon. Thus, in comparison to the hole transporting layer of the single structure having only the first material, the hole transporting layer of the mixed structure having the first material and the second material enables to increase the lifespan of the OLED apparatus.

The hole transporting layer of the mixed structure includes the second material with the high thermal stability. Thus, in comparison to the hole transporting layer of the single structure having only the first material, the hole transporting layer of the mixed structure having the first material and the second material enables to increase the lifespan of the OLED apparatus.

The weight percent ratio of the first material to the second material included in the hole transporting layer of the mixed structure is optimized. Thus, in comparison to the hole transporting layer of the single structure having only the first material or only the second material, the hole transporting layer of the mixed structure having the first material and the second material enables to lower the driving voltage, to improve the light-emission efficiency, and to increase the lifespan of the OLED apparatus.

According to one embodiment of the present disclosure, there is provided an organic light emitting display (OLED) apparatus that may include an anode, a cathode, and a light-emitting unit between the anode and the cathode, wherein the light-emitting unit includes a first emission layer, and a first hole transporting layer having first and second materials. The first material may have a larger hole mobility than that of the second material so as to improve a transfer of holes from the first hole transporting layer to the first emission layer, and the second material may have a higher triplet energy level than that of the first material so as to reduce a transfer of electrons from the first emission layer to the first hole transporting layer. Accordingly, it is possible to realize the low driving voltage, improved light-emission efficiency and increased lifespan in the OLED apparatus.

In the OLED apparatus according to one embodiment of the present invention, a HOMO (highest occupied molecular orbitals) level of the second material may be lower than a HOMO level of the first material so as to minimize an accumulation of the holes on the interface of the first hole transporting layer. Accordingly, it is possible to minimize deterioration by the hole accumulated on the interface between the first hole transporting layer and its adjoining organic layer, thereby increasing the lifespan of the OLED apparatus.

In the OLED apparatus according to one embodiment of the present invention, there is provided an additional hole transporting layer between the first emission layer and the first hole transporting layer.

In the OLED apparatus according to one embodiment of the present invention, the first hole transporting layer may be a single layer.

In the OLED apparatus according to one embodiment of the present invention, on assumption that the weight total of the first material and the second material is 100 wt %, the first material may be within a range from 50 wt % to 90 wt %, and the second material may be within a range from 10 wt % to 50 wt %.

In the OLED apparatus according to one embodiment of the present invention, a thickness of the first hole transporting layer may be within a range from 70 nm to 150 nm so as to optimize a micro-cavity effect of light emitted from the first emission layer due to a distance between the anode and the cathode.

In the OLED apparatus according to one embodiment of the present invention, the first hole transporting layer may include a mixed layer having the first material and the second material, and at least one non-mixed layer having only one of the first material and the second material.

In the OLED apparatus according to one embodiment of the present invention, the non-mixed layer includes a first non-mixed layer having the first material, and a second non-mixed layer having the second material, wherein the first non-mixed layer is disposed closer to the anode than the second non-mixed layer so as to help a transfer of the hole to the first emission layer, and the second non-mixed layer is disposed closer to the first emission layer than the first non-mixed layer so as to prevent a transfer of the electron from the first emission layer.

In the OLED apparatus according to one embodiment of the present invention, on assumption that the weight total of the first material and the second material included in the mixed layer is 100 wt %, the first material may be within a range from 50 wt % to 90 wt %, and the second material may be within a range from 10 wt % to 50 wt %.

In the OLED apparatus according to one embodiment of the present invention, a thickness of the first non-mixed layer or a thickness of the second non-mixed layer may be equal to 40% or less than 40% in comparison to a thickness of the mixed layer.

In the OLED apparatus according to one embodiment of the present invention, a hole mobility of the first material may be equal to $1\times10\text{-}4\ cm^2/Vs$ or larger than $1\times10\text{-}4\ of/Vs$.

In the OLED apparatus according to one embodiment of the present invention, a triplet energy level of the second material may be within a range from $-2.7$ eV to $-2.6$ eV, and a HOMO level of the second material may be within a range from $-5.2$ eV to $-4.7$ eV.

In the OLED apparatus according to one embodiment of the present invention, a peak wavelength of the light emitted from the first emission layer may be within a range from 440 nm to 480 nm allowing blue light to be emitted from the light-emitting unit.

In the OLED apparatus according to one embodiment of the present invention, the light-emitting unit for emitting white light includes a first stack including the first emission layer and the first hole transporting layer; a second stack including a second emission layer on the first stack; and a third stack including a third emission layer on the second stack, wherein a peak wavelength of the light emitted from the first emission layer and the third emission layer is within a range from 440 nm to 480 nm, and a peak wavelength of the light emitted from the second emission layer is within a range from 540 nm to 580 nm.

According to another aspect of the embodiment of the present disclosure, there is provided an OLED apparatus that may include an anode, a cathode, and at least one emission layer and at least one hole transporting layer between the anode and the cathode, wherein the at least one hole transporting layer has a mixed structure including two materials with different properties. Accordingly, it is possible to realize the low driving voltage, improved light-emission efficiency and increased lifespan in the OLED apparatus.

In the OLED apparatus according to another embodiment of the present invention, the at least one hole transporting layer may have the mixed structure including a first material having a larger hole mobility than that of a second material, and a second material having a higher triplet energy level than that of the first material. Accordingly, a transfer of hole to the emission layer becomes easier, thereby lowering the driving voltage and improving the light-emission efficiency of the OLED apparatus. Also, it is possible to reduce a damage of the hole transporting layer by an electron diffused from the emission layer to the hole transporting layer, thereby increasing the lifespan of the OLED apparatus.

In the OLED apparatus according to another embodiment of the present invention, a HOMO level of the second material may be lower than a HOMO level of the first material. Accordingly, it is possible to minimize deterioration by the hole accumulated on the interface between the hole transporting layer and its adjoining organic layer, thereby increasing the lifespan of the OLED apparatus.

In the OLED apparatus according to another embodiment of the present invention, on assumption that the weight total of the first material and the second material included in the at least one hole transporting layer is 100 wt %, the first material may be within a range from 50 wt % to 90 wt %, and the second material may be within a range from 10 wt % to 50 wt %.

In the OLED apparatus according to another embodiment of the present invention, the hole mobility of the first material may be equal to $1\times10\text{-}4$ cm$^2$/Vs or larger than $1\times10\text{-}4$ cm$^2$/Vs.

In the OLED apparatus according to another embodiment of the present invention, the triplet energy level of the second material may be within a range from $-2.7$ eV to $-2.6$ eV, and the HOMO level of the second material may be within a range from $-5.2$ eV to $-4.7$ eV.

It will be apparent to those skilled in the art that various modifications and variations can be made in the present disclosure without departing from the scope of the disclosures. Thus, it is intended that the present disclosure covers the modifications and variations of this disclosure provided they come within the scope of the appended claims and their equivalents.

What is claimed is:

1. An organic light emitting display (OLED) apparatus comprising,
   an anode and a cathode; and
   a light-emitting unit between the anode and the cathode,
   wherein the light-emitting unit includes a first emission layer and a first hole transporting layer,
   wherein the first hole transporting layer has first material and second material,
   wherein the first material has a higher hole mobility than that of the second material so as to improve a transfer of holes from the first hole transporting layer to the first emission layer, and the second material has a higher triplet energy level than that of the first material so as to reduce a transfer of electrons from the first emission layer to the first hole transporting layer.

2. The OLED apparatus according to claim 1, wherein a HOMO (highest occupied molecular orbitals) level of the second material is lower than a HOMO level of the first material so as to minimize an accumulation of the holes on the interface of the first hole transporting layer.

3. The OLED apparatus according to claim 2, further comprising an additional hole transporting layer between the first emission layer and the first hole transporting layer.

4. The OLED apparatus according to claim 2, wherein the first hole transporting layer is a single layer.

5. The OLED apparatus according to claim 4, wherein, when a total weight of the first material and the second material is 100 wt %, the first material is within a range from 50 wt % to 90 wt %, and the second material is within a range from 10 wt % to 50 wt %.

6. The OLED apparatus according to claim 5, wherein a thickness of the first hole transporting layer is within a range from 70 nm to 150 nm so as to optimize a micro-cavity effect of light emitted from the first emission layer due to a distance between the anode and the cathode.

7. The OLED apparatus according to claim 2, wherein the first hole transporting layer includes a mixed layer having the first material and the second material, and at least one non-mixed layer having only one of the first material and the second material.

8. The OLED apparatus according to claim 7,
   wherein the non-mixed layer includes a first non-mixed layer having the first material, and a second non-mixed layer having the second material, and
   wherein the first non-mixed layer is disposed closer to the anode than the second non-mixed layer so as to help a transfer of the hole to the first emission layer, and the second non-mixed layer is disposed closer to the first emission layer than the first nonmixed layer so as to prevent a transfer of the electron from the first emission layer.

9. The OLED apparatus according to claim 8,
   Wherein when a total weight of the first material and the second material included in the mixed layer is 100 wt %,
   the first material is within a range from 50 wt % to 90 wt %, and
   the second material is within a range from 10 wt % to 50 wt %.

10. The OLED apparatus according to claim 8, wherein a thickness of the first nonmixed layer or a thickness of the second non-mixed layer is equal to 40% or less than 40% in comparison to a thickness of the mixed layer.

11. The OLED apparatus according to claim 2, wherein a hole mobility of the first material is equal to $1\times10\text{-}4$ cm$^2$/Vs or higher than $1\times10\text{-}4$ cm$^2$/Vs.

12. The OLED apparatus according to claim 2, wherein a triplet energy level of the second material is within a range from $-2.7$ eV to $-2.6$ eV, and a HOMO level of the second material is within a range from $-5.2$ eV to $-4.7$ eV.

13. The OLED apparatus according to claim 2, wherein a peak wavelength of the light emitted from the first emission layer is within a range from 440 nm to 480 nm.

14. The OLED apparatus according to claim 2, wherein the light-emitting unit for emitting a white light includes:
    a first stack including the first emission layer and the first hole transporting layer;
    a second stack including a second emission layer on the first stack; and
    a third stack including a third emission layer on the second stack,
    wherein a peak wavelength of the light emitted from the first emission layer and the third emission layer is within a range from 440 nm to 480 nm, and
    a peak wavelength of the light emitted from the second emission layer is within a range from 540 nm to 580 nm.

15. An organic light emitting display (OLED) apparatus comprising,
    an anode, a cathode, and at least one emission layer between the anode and the cathode, and at least one hole transporting layer between the anode and the cathode,
    wherein the at least one hole transporting layer has a mixed structure including two different materials,
    wherein the at least one hole transporting layer has the mixed structure including a first material having a higher hole mobility than that of a second material, and the second material having a higher triplet energy level than that of the first material.

16. The OLED apparatus according to claim 15, wherein a HOMO level of the second material is lower than a HOMO level of the first material.

17. The OLED apparatus according to claim 16, wherein, when a total weight of the first material and the second material included in the at least one hole transporting layer is 100 wt %,
    the first material is within a range from 50 wt % to 90 wt %, and
    the second material is within a range from 10 wt % to 50 wt %.

18. The OLED apparatus according to claim 16, wherein the hole mobility of the first material is equal to $1\times10\text{-}4$ cm$^2$/Vs or higher than $1\times10\text{-}4$ cm$^2$/Vs.

19. The OLED apparatus according to claim 16, wherein the triplet energy level of the second material is within a range from −2.7 eV to −2.6 eV, and the HOMO level of the second material is within a range from 5.2 eV to −4.7 eV.

* * * * *